(12) United States Patent
Winter et al.

(10) Patent No.: US 9,847,274 B2
(45) Date of Patent: Dec. 19, 2017

(54) ELECTRONIC MODULE AND METHOD OF MANUFACTURING THE SAME

(71) Applicant: Infineon Technologies AG, Neubiberg (DE)

(72) Inventors: Frank Winter, Regensburg (DE); Ottmar Geitner, Pentling (DE); Ivan Nikitin, Regensburg (DE); Jürgen Högerl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/375,855

(22) Filed: Dec. 12, 2016

(65) Prior Publication Data

US 2017/0092563 A1  Mar. 30, 2017

Related U.S. Application Data

(62) Division of application No. 13/964,263, filed on Aug. 12, 2013, now Pat. No. 9,532,459.

(51) Int. Cl.
| | |
|---|---|
| *H01L 23/433* | (2006.01) |
| *H01L 23/31* | (2006.01) |
| *H01L 25/00* | (2006.01) |
| *H01L 21/48* | (2006.01) |

(Continued)

(52) U.S. Cl.
CPC ...... *H01L 23/4334* (2013.01); *H01L 21/4871* (2013.01); *H01L 21/565* (2013.01); *H01L 23/3121* (2013.01); *H01L 24/32* (2013.01); *H01L 24/83* (2013.01); *H01L 2224/32225* (2013.01); *H01L 2224/32245* (2013.01); *H01L 2224/838* (2013.01); *H01L 2224/8384* (2013.01); *H01L 2224/83801* (2013.01)

(58) Field of Classification Search
CPC .......... Y10T 29/49002; H01L 21/4871; H01L 21/565; H01L 23/3121; H01L 23/4334; H01L 2224/32225; H01L 2224/32245; H01L 2224/838; H01L 2224/83801; H01L 2224/8384; H01L 24/32; H05K 1/185; H05K 3/4608
USPC ............... 361/679.46–679.54, 688–723, 728
See application file for complete search history.

(56) References Cited

U.S. PATENT DOCUMENTS

| | | | |
|---|---|---|---|
| 5,455,462 A * | 10/1995 | Marrs | H01L 21/4878 257/712 |
| 9,532,459 B2 * | 12/2016 | Winter | H05K 1/185 |

(Continued)

FOREIGN PATENT DOCUMENTS

| | | |
|---|---|---|
| CN | 101127382 A | 2/2008 |
| CN | 102047456 A | 5/2011 |
| CN | 103137846 A | 6/2013 |

*Primary Examiner* — Anthony Haughton
*Assistant Examiner* — Yahya Ahmad

(57) ABSTRACT

According to an exemplary aspect an electronic module is provided, wherein the electronic module comprises an electronic chip comprising at least one electronic component, a spacing element comprising a main surface arranged on the electronic chip and being in thermally conductive connection with the at least one electronic component, and a mold compound at least partially enclosing the electronic chip and the spacing element, wherein the spacing element comprises a lateral surface which is in contact to the mould compound and comprises surface structures.

20 Claims, 2 Drawing Sheets

(51) Int. Cl.
*H01L 21/56* (2006.01)
*H01L 23/00* (2006.01)

(56) References Cited

U.S. PATENT DOCUMENTS

| | | | |
|---|---|---|---|
| 2005/0036291 A1* | 2/2005 | Huang | H01L 21/4882 361/704 |
| 2005/0127534 A1* | 6/2005 | Stecher | H01L 23/3142 257/787 |
| 2010/0103634 A1* | 4/2010 | Funaya | H01L 23/5389 361/761 |
| 2013/0020694 A1* | 1/2013 | Liang | H01L 25/072 257/691 |
| 2013/0105955 A1* | 5/2013 | Kim | H01L 24/32 257/676 |
| 2014/0185243 A1* | 7/2014 | Joo | H01L 23/473 361/709 |

\* cited by examiner

ELECTRONIC MODULE AND METHOD OF MANUFACTURING THE SAME

The present application is a divisional of U.S. patent application Ser. No. 13/964,263, filed Aug. 12, 2013, incorporated herein by reference in their entirety.

TECHNICAL FIELD

The present disclosure relates to an electronic module. Moreover, the present disclosure relates to a method of manufacturing an electronic module.

BACKGROUND

In the art a plurality of electronic modules are known which comprises an electronic or semiconductor chip providing some electronic functionality. The electronic chip may be arranged or placed on a substrate and may be housed or packaged by a mold compound enclosing the electronic chip.

Due to the housing by the mold compound the dissipation of heat generated by the electronic chip may be an object. This may be true in case the electronic module forms or is part of a power module, i.e. a module adapted and intended to handle a rather high power, e.g. several orders of magnitudes higher than for electronic modules used in the field of information technology.

Such power modules are used in batteries or electro motors, e.g. in the field of electro automobiles. These batteries and electro motors may be heavily strained or stressed in operation during the charging and discharging processes leading to a high and rapid heat generation which may be destructive for the function of the batteries and motors. Thus, the dissipation of the generated heat is may be an issue to be taken into consideration when constructing or designing such power modules. For example, materials may be used for substrates of a chip mounting or when manufacturing lead frames, wherein the materials having a high thermal conductivity. Additionally, a heat conductive material can be used as a top layer or outer layer of the electronic module to provide a large contact area or interface to the environment which may function as a heat sink for the module or package.

The heat dissipation may be improved such that heat sinks may be provided on both main surfaces of the power module. The heat sinks are thermally coupled to the semiconductor chip wherein one heat sink may be used for cooling one side of the chip while the other heat sink is in thermal contact to the other side. The heat sinks in turn may be thermally coupled to the outside or environment by air convection or liquid cooling.

In particular, the front side or front surface of the semiconductor chip has to be cooled. For conventional electronic modules or packages the front side of the semiconductor chip is thermally contacted by bond wires or clips in addition to the mold compound leading to a local discharge of the heat due to the greatly different heat conductivity of the mold compound and material of the bonding or clips.

To increase the heat dissipation of the electronic module in addition to the heat dissipation of the front side of the electronic chip via the spacing element and the DCB the back side of the electronic chip may be connected to a heat sink as well which is formed on the back side of the substrate. There may potential room to provide improved electronic modules.

SUMMARY

According to an exemplary aspect an electronic module is provided, wherein the electronic module comprises an electronic chip comprising at least one electronic component, a spacing element comprising a main surface arranged on the electronic chip and being in thermally conductive connection with the at least one electronic component, and a mold compound at least partially enclosing the electronic chip and the spacing element, wherein the spacing element comprises a lateral surface which is in contact to the mould compound and comprises surface structures.

According to an exemplary aspect a method of manufacturing an electronic module is provided, wherein the method comprises forming a spacing element comprising a conductive material and comprising a main surface and a lateral surface comprising at least one surface structure, contacting the main surface of the spacing element to an electronic chip in a thermally conductive way, molding a molding compound at least partially around the spacing element and the electronic chip so that the molding compound is in contact with the at least one surface structure of the spacing element.

According to an exemplary aspect an electronic module is provided, wherein the module comprises an electronic arrangement, and a mold compound at least partially enclosing the electronic arrangement, wherein the electronic arrangement comprises a substrate, an electronic chip arranged on the substrate, and a spacing element arranged on the electronic chip, wherein the electronic arrangement comprises a lateral surface comprising surface structures adapted to increase a surface area of the electronic arrangement, wherein the mold compound is in direct contact to the surface structures.

BRIEF DESCRIPTION OF THE DRAWINGS

The accompanying drawings, which are included to provide a further understanding of exemplary embodiments and constitute a part of the specification, illustrate exemplary embodiments of the disclosure.

In the drawings.

DESCRIPTION OF FURTHER EXEMPLARY EMBODIMENTS

Figure 1A:
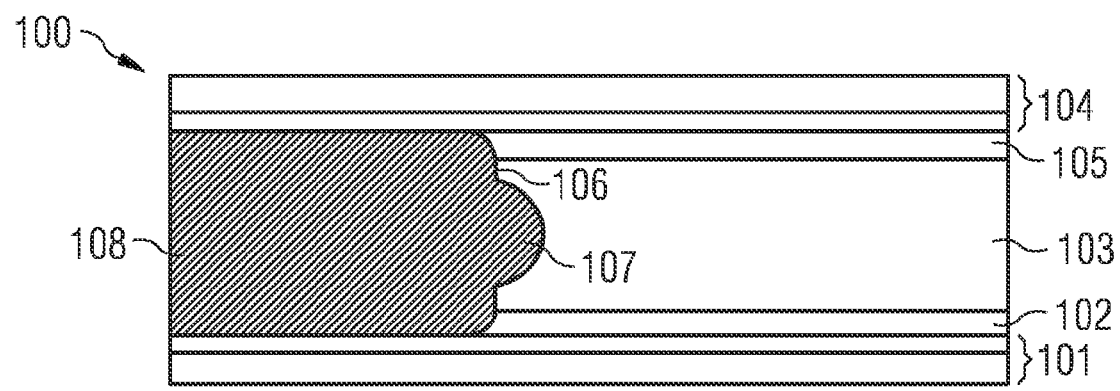
FIGS. 1A to 1C show cross sectional views of electronic modules according to exemplary embodiments.

In the following, further exemplary embodiments of the electronic module and the method of manufacturing the same will be explained. It should be noted that embodiments described in the context of the electronic module may also be combined with embodiments of the method of manufacturing the electronic module and vice versa.

The spacing element may comprise a conductive material. For example, the conductive material may be thermally and/or electrically conductive. The spacing element may also fulfil a levelling effect balancing differences in height of components or layers of the electronic module. The electronic chip may comprise or may be formed by a power transistor, i.e. a switching element suitable for switching electrical power in the amount of several tens or hundreds of watts. Such power transistors have to be distinguished from transistors used for switching information signals, e.g. in integrated circuits of a processor or memory. Alternatively, the electronic module may comprise a dense array of electronic circuits also leading to a high heat generation which has to be dissipated.

By providing a spacing element having a lateral surface comprising surface structures it may be possible to increase a contacting surface or interface between the spacing element and the mold compound. By increasing the contacting surface or interface between the spacing element and the mold compound it may be possible to decrease the probability of delamination.

Delamination of the mold compound and/or between the electronic chip and the spacing element and/or the mold compound may be reduced. Such a delamination may occur due to different thermal expansion of the mold compound and of the electronic chip and/or the material of the spacing element and may lead to the failure of the electronic module, e.g. due to breaking of electrical paths from and to the electronic component. However, since the surface structures may increase the total surface being available for direct contacting between the mold compound and the spacing element the failure risk of the electronic module may be decreased. An improved electronic module may be provided which may fulfil its functions for more temperature cycles, i.e. heating up and cooling down again, without breaking of electronics or electric paths in the electronic module due to delamination effects, for example.

The term "surface structure" may denote any structure or feature which does not have a smooth surface, i.e. which has an increased surface compared to a smooth surface. In other words a surface comprising surface structures may have, in a cross-sectional view, a boundary line which is not straight or does not form a straight line. Thus, a surface structure may provide for a real three-dimensional form or shape of the surface instead of a quasi-two-dimensional form. Such a quasi-two-dimensional form may be a form which is plane or smooth except for minor unintentional or unavoidable projections and/or recesses, while a real three-dimensional form provides for a non-planar surface.

The electronic module may be a power module, e.g. a power transistor or a similar electronic module adapted to withstand high voltage. The term "high voltage" may denote a voltage which is higher than typical voltages used for information signals. For example the power transistor may withstand a voltage of hundred or even several hundreds of volts.

The surfaces structures are three-dimensional structures. Such surface structures may provide that the lateral surface on or at which the surface structures are formed has an increased surface compared to a smooth or planar or quasi two-dimensional surface. That is, the lateral surface may be increased by the surface structure. The lateral surface may be a surface which is perpendicular or at least substantially perpendicular to the main surface of the spacing element. It should be noted that the spacing element may be quasi two-dimensional, e.g. having a thickness of between 0.1 mm and 10 mm, or between 0.5 mm and 5 mm, or between 1.0 mm and 3.5 mm, e.g. about 2.5 mm while having an area between 0.25 mm$^2$ and 200 mm$^2$, or between 0.5 mm$^2$ and 100 mm$^2$, e.g. in the range of 40 mm$^2$ and 60 mm$^2$. However, the spacing element may also have rather the form of a block, i.e. a real three-dimensional element, wherein the extension in all three space directions may be in the same order of magnitude, while a quasi-two-dimensional element may have one space direction into which the extension is much smaller than in the other two space direction. For example, the electronic chip may be arranged, mounted or fixed on a substrate, e.g. by surface mounting technology by soldering, clamping or any other suitable technology. The electronic module may be electrically connected to the substrate, e.g. by wire bonding, soldering or surface mounting technology.

It should be noted that the electronic module may comprise additional spacing elements which may be arranged laterally with respect to each other and/or may be arranged vertically with respect to each other, i.e. may form a stacked arrangement. Several or all of the additional spacing elements may comprise lateral or side surfaces comprising surface structures. Additional, several electronic chips may be arranged horizontally and/or vertically with respect to each other in or at the electronic module. The mold compound may comprise a thermoplast material, a thermoset material, a plastomere material or an epoxy material. It should be noted that the lateral surface of the spacing element may have no solder on it or is solder-free so that an adhesion or grip of the mold compound on the lateral surface may be increased.

In the method of manufacturing an electronic module the forming a spacing element may comprise designing a lateral surface which has an increased surface area compared to a planar lateral surface which is substantially perpendicular to the main surface of the spacing element.

According to an exemplary embodiment of the electronic module the at least one surface structure comprises at least one structure out of the group consisting of a recess, a protrusion, a concave structure, a convex structure, and a barb.

All the described surface structures or surface features may be suitable structures to increase the surface area contacting the mold compound and thus may be suitable to provide some kind of cogging to decrease the probability of delamination. The above structures may have the described form or shape in a cross sectional view. In other words the structures, e.g. the protrusion or the recess may be formed in the lateral surface of the spacing element in a direction substantially perpendicular to the area or plane of the lateral surface.

According to an exemplary embodiment of the electronic module the spacing element comprises a thermally conductive material.

For example, the thermally conductive material may be metal or a thermally conductive plastic material. Examples of a metal material may be copper, molybdenum, nickel, aluminium or the like. The specific thermal conductivity may be above a predetermined thermal threshold value. It may be above 10 W/(m·K) or even above 100 W/(m·K). The spacing element, e.g. the material of the spacing element, may be chosen to be structurable, i.e. can be structured or patterned, e.g. to form conductive patterns or paths in or on the spacing element. All the described materials may be suitable materials for a spacing element since on the one hand these materials may be easily structurable while on the other hand provide a good thermal conductivity allowing for a good heat conduction or dissipation.

According to an exemplary embodiment of the electronic module the spacing element comprises an electrically conductive material.

For example, the specific electric conductivity of the conductive material may be above a given threshold value, for example it may be above $1·10^5$ S/m or even above $1·10^6$ S/m.

According to an exemplary embodiment the electronic module further comprises at least one outer heat conductive layer in thermal connection to the spacing element.

The at least one outer heat conductive layer may be a metal layer or metal block, like a copper, aluminium or molybdenum block or layer. The outer heat conductive layer or structure may form a heat sink for the electronic module and may be arranged at the outermost surface of the electronic module so that it may act as a heat dissipating surface of the electronic module. The at least one outer heat conductive layer may be arranged on an upper side of the electronic module or at a lower side of the electronic module. For example, the at least one heat conductive layer may be arranged on a main surface of the electronic module in such a way that the spacing element is arranged between the electronic chip and the at least one outer heat conductive layer. Alternatively, the at least one outer heat conductive surface is arranged on another main surface of the electronic module in such a way that the electronic chip is arranged between the spacing element and the at least one heat conductive surface. For example the outer heat conductive layer may form a lid or lid structure.

According to an exemplary embodiment the electronic module further comprises a further outer heat conductive layer, wherein the further outer heat conductive layer is arranged on a main surface of the electronic module which is opposite to a further main surface of the electronic module on which the at least one heat conductive surface is arranged.

The provision of a second outer heat conductive layer on an opposite side than the first outer heat conductive layer may improve the heat dissipation of the electronic module.

According to an exemplary embodiment of the electronic module, wherein the spacing element is fixed to the electronic chip by one process out of the group consisting of soldering, sintering, and gluing.

A solder structure may be used when soldering which solder structure may be a solder layer. The solder structure, formed for example by solder balls, solder paste, solder bumps or the like, may provide for an efficient way to electrically and thermally connecting the spacing element and the electronic chip to each other and at the same time providing a sufficiently strong connection between the same.

According to an exemplary embodiment of the electronic module the spacing element is formed by a stamping, punching, milling, sintering, turning, rolling, peening (e.g. shot peening), e.g. by using corundum, of a pre-element. The stamping may be performed in such a way that a ridge is formed in the middle of the lateral surface of the spacing element, which ridge may form the surface structures of the spacing element. Such a ridge may be achieved by using two plates for stamping wherein one is pressed from the upper side and one from the lower side of onto the pre-element.

According to an exemplary embodiment of the electronic module the at least one surface structure is configured for increasing the area of the lateral surface in comparison to a planar sidewall extending perpendicular to the main surface.

According to an exemplary embodiment of the electronic module the at least one surface structure constitutes a curved lateral surface According to an exemplary embodiment the method of manufacturing an electronic module further comprises forming the at least one surface structure on a pre-element by at least one process out of the group consisting stamping, pressing molding, sputtering, milling, sintering, peening, and rolling.

All the described methods of structuring the pre-element may provide for an efficient way to form surface structures in the pre-element by providing projections and/or indentations or recesses. For example, a stamping process may be performed by two stamping plates or tools acting on the pre-element on both sides so that a ridge may be formed in the middle of the lateral surface of the pre-mold which may form the surface structures of the spacing element afterwards.

According to an exemplary embodiment of the method of manufacturing the contacting of the main surface of the spacing element to the electronic chip is performed by one process selected out of the group consisting of soldering, sintering, and glueing.

In principle any fixing method or fixing process can be selected which allows for a sufficient strong or stable fixing while at the same time provide a sufficient heat contact. For example, soldering may allow for a simple and efficient way to fix the spacing element and the electronic chip to each other as well as providing a sufficient heat contact between the two components.

According to an exemplary embodiment of the method of manufacturing the surface structures are formed in the spacing element.

Alternatively or additionally also the substrate may comprise surface structures on at least one lateral surface.

According to an exemplary embodiment the electronic arrangement further comprises a plurality of spacing elements.

The spacing elements may be arranged vertically atop of each other and/or laterally with respect to each other. By providing a stacked package or module it may be possible to increase a power capability of the electronic module while the necessary area is not increased. Due to the good thermal conductivity of the spacing elements and the provision of an increased lateral surface area (leading to a decreased probability of delamination) it may be possible to sufficiently cool the electronic module even when it is formed in a stacked manner.

Summarizing a gist of an exemplary embodiment may be seen in providing a packaged or housed electronic module comprising a spacing element between an electronic chip and an outer heat conductive layer, e.g. a direct copper board, wherein lateral surfaces of the spacing element comprises surface structures. These surface structures increasing a contacting surface or contact area between the spacing element and a molding compound of the electronic module and may thus lead to a decreased probability of delamination and therefore for a reduced probability of failure of the electronic module.

Such delamination may be caused by differences in thermal expansion coefficients between different materials of the electronic module leading, depending on the actual temperature, to mechanical stress in the electronic module, wherein the mechanical stress may peak at the lateral surfaces of the spacing element. Thus, the provision of surface structures increasing the surface and possibly providing some kind of barbing or hooking effect may be an efficient way to reduce the probability of delamination which would afterwards possibly cause electrical failures when using the electronic module. Without the surface structures delamination may occur between the mold compound and an upper substrate, e.g. a DCB.

Additionally, it should be mentioned that the surface structures at the lateral surfaces may also reduce or avoid initial delamination, i.e. delamination which occurs even before a first temperature cycle possibly caused by low adhesion of the mould compound which may be increased due to a barb functionality of the surface structures.

DETAILED DESCRIPTION OF THE FIGURES

The above and other objects, features and advantages of the present embodiments will become apparent from the following description and the appended claims, taken in conjunction with the accompanying drawings, in which like parts or elements are denoted by like reference numbers.

The illustration in the drawing is schematically and not necessarily to scale.

FIG. 1 shows cross sectional views of electronic modules according to exemplary embodiments.

FIG. 1A shows a cross sectional view of a detail of an electronic module 100 according to a first exemplary embodiment and comprising a substrate 101, e.g. a direct copper bonding substrate (DCB) comprising a copper sub-layer and a ceramic sub-layer, on which an electronic chip or element, like a power transistor, e.g. an IGBT (insulated gate bipolar transistor), is arranged (not shown). Onto the substrate 101 and the electronic chip a solder layer 102 is arranged to fix a spacing element 103 onto the substrate. The spacing element may have a thickness of about 2.5 mm and is formed by a heat conducting material, e.g. copper, molybdenum, nickel or the like. Onto the spacing element 103 a DCB 104, which comprises a copper sub-layer and a ceramic sub-layer, is placed by an additional solder layer 105. As can be seen in FIG. 1A a lateral surface 106 of the spacing element 103 is not planar but comprises a surface structure 107 which is a substantially concave recess in the embodiment of FIG. 1A. Furthermore, the electronic module comprises a housing or packaging which is formed by a mold compound 108. The mold compound 108 engages with the surface structure 107, i.e. the recess formed in the spacing element, thus leading to an improved contact between the spacing element 103 and the mold compound 108. This improved contact may lead to a decreased probability of delamination and thus possibly increase the quality of the electronic module 100.

Figure 1B:
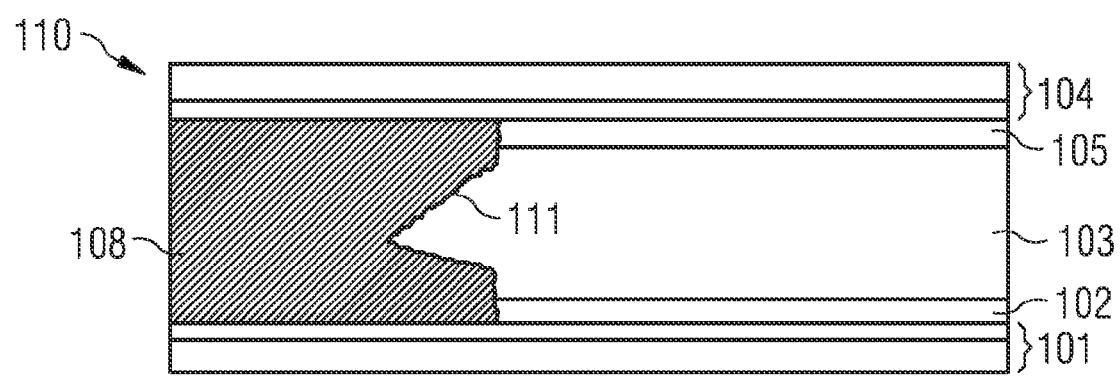

FIG. 1B shows a cross sectional view of a detail of an electronic module 110 according to a second exemplary embodiment which is similar to the one depicted in FIG. 1A. However, the embodiment of FIG. 1B comprises a projection 111, which substantially forms a triangle, as a surface structure of the spacing element 103. Such a projection may be formed by stamping a pre-element by two stamping plates from opposite sides.

Figure 1C:
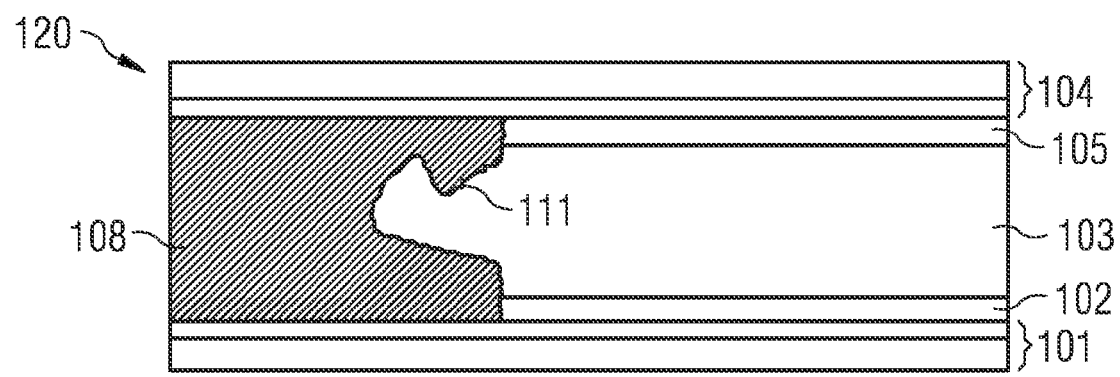

FIG. 1C shows a cross sectional view of a detail of an electronic module 120 according to a third exemplary embodiment which is similar to the one depicted in FIG. 1B. However, the projection 111 forms a barb or flake in the third exemplary embodiment shown in FIG. 1C.

FIG. 2 schematically shows three exemplary processes for forming surface structures on or in a spacing element 200. The spacing element 200 may, be made from material which does have insufficient mold compound adhesion or may have an additional surface (e.g. Au) with insufficient mold compound adhesion. In a first step some surface elements, e.g. contact layers or impurities, arranged or formed on a pre-element 201 may be removed, e.g. by etching, polishing, or peening using sand for example from lateral surfaces of the pre-element 201.

Figure 2C:
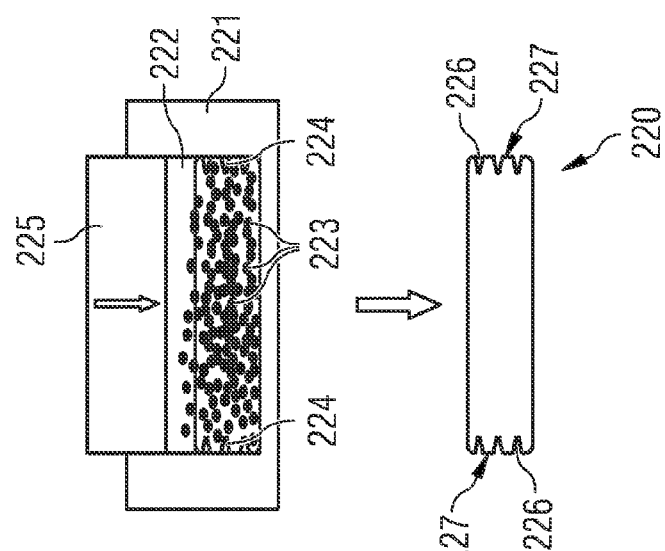
FIGS. 2A to 2C schematically show processes for forming surface structures on a spacing element.

In a next step surface structures 202 are formed in the lateral surfaces 203 of the pre-element 201. According to FIG. 2A the surface structures 202 are formed by a milling tool 204 as schematically depicted in FIG. 2A. The milling tool generates grooves in the pre-element 201 forming thereby the spacing element 200.

Figure 2B:
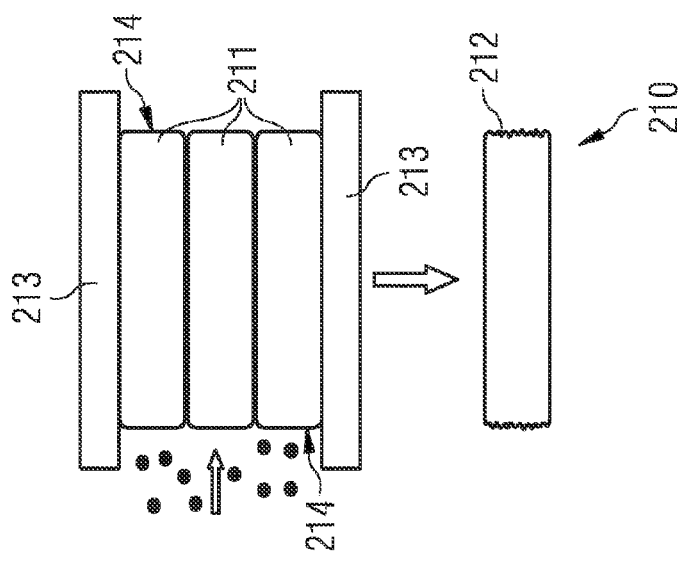
Figure 2A:
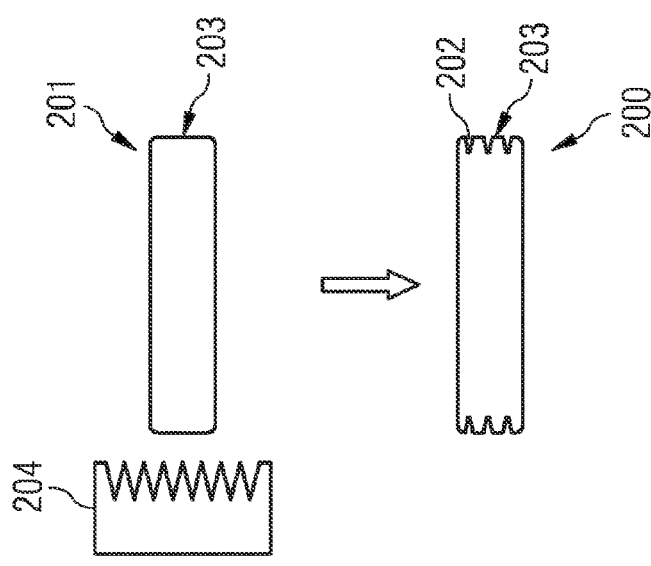

FIG. 2B shows another possibility to provide surface structures 212 in the lateral surfaces of pre-elements 211 to form a spacing element 210. The surface structures 212 may be formed by using abrasive particles 213 in a sputtering or peening process leading to dents 212 in the lateral surfaces 214 of the pre-element 211. During the sputtering process several pre-elements 211 may be processed together and may be arranged between two stamps or punches 213 arranged above and below the pre-elements and used to fix or hold the pre-elements 211. Again the lower portion of FIG. 2B shows the final spacing element 210 after the peening step.

FIG. 2C shows another possible way to form a spacing element 220. According to the embodiment of FIG. 2C a sintering process is used to manufacture the spacing element 220. In the sintering process a tool 221 is used which is filled with the heat conductive material used for forming the spacing element, e.g. copper, molybdenum or nickel or a plastic heat conductive material. The material may be filled in a cavity 222 formed by the tool as a powder or particles 223. Furthermore, the tool 220 comprises projections 224 at the surfaces of the cavity 221. For manufacturing the spacing element 200 a punch 225 is used to compact the material particles and at the same time the tool is subjected to a sintering process by heating the tool filled with the conductive material. Again the lower part of FIG. 2C shows the built spacing element 220 which looks similar to the one in the lower part of FIG. 2A and comprises surface structures 226 in lateral surfaces 227 of the spacing element 220.

All the processes shown in FIG. 2 provide for a spacing element 200, 210, 220 having surface structures at lateral surfaces which surface structures may improve an adhesion between a later mold compound and the spacing element so that a probability of a later delamination may be decreased.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the exemplary embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic module comprising,
   an electronic chip comprising at least one electronic component,
   a spacing element comprising a main surface arranged on the electronic chip and being in thermal conductive connection with the at least one electronic component; and
   a mold compound at least partially enclosing the electronic chip and the spacing element;
   wherein the spacing element comprises a lateral surface comprising at least one surface structure which provides an interface with the mold compound,
   wherein the surface structure comprises a three-dimensional form.

2. The electronic module according to claim 1 wherein the lateral surface is substantially perpendicular to the main surface of the spacing element.

3. The electronic module according to claim 1, wherein the lateral surface is in contact with the mold compound.

4. The electronic module according to claim 1, wherein the at least one surface structure comprises at least one structure out of the group consisting of:
   a recess, a protrusion,
a concave structure,
a convex structure, and
a barb.

5. The electronic module according to claim 4, wherein the at least one surface structure forming the protrusion extends into the mold structure.

6. The electronic module according to claim 4, wherein the at least one surface structure forming the protrusion has a triangle shape.

7. The electronic module according to claim 1, wherein the spacing element comprises a thermally conductive material.

8. The electronic module according to claim 1, wherein the spacing element comprises an electrically conductive material.

9. The electronic module according to claim 1, further comprising at least one outer heat conductive layer in thermal connection to the spacing element.

10. The electronic module according to claim 9, further comprising a further outer heat conductive layer, wherein the further outer heat conductive layer is arranged on a main surface of the electronic module which is opposite to a further main surface of the electronic module on which the at least one heat conductive surface is arranged.

11. The electronic module according to claim 1, wherein the spacing element is fixed to the electronic chip by one process out of the group consisting of:
    soldering;
    sintering; and
    gluing.

12. The electronic module according to claim 1, wherein the at least one surface structure is configured for increasing the area of the lateral surface in comparison to a planar sidewall extending perpendicular to the main surface.

13. The electronic module according to claim 1, wherein the at least one surface structure constitutes a curved lateral surface.

14. A method of manufacturing an electronic module, the method comprising:
    providing an electronic chip comprising at least one electronic component;
    forming a spacing element comprising a main surface arranged on the electronic chip and a lateral surface comprising at least one surface structure;
    contacting the main surface of the spacing element to the electronic chip in a thermally conductive way;
    molding a molding compound at least partially enclosing the spacing element and the electronic chip, so that the molding compound provides an interface with the at least one surface structure of the spacing element,
    wherein the surface structure comprises a three-dimensional form.

15. The method according to claim 14, further comprising:
    forming the at least one surface structure on a pre-element by at least one process out of the group consisting:
    stamping;
    pressing;
    molding;
    sputtering;
    milling;
    sintering;
    peening; and
    rolling.

16. The method according to claim 14, wherein the contacting of the main surface of the spacing element to the electronic chip is performed by one process selected out of the group consisting of:
    soldering;
    sintering; and
    glueing.

17. An electronic module, the module comprising:
    an electronic arrangement; and
    a mold compound at least partially enclosing the electronic arrangement,
    wherein the electronic arrangement comprises a substrate, an electronic chip arranged on the substrate, and a spacing element arranged on the electronic chip,
    wherein the electronic arrangement further comprises a lateral surface comprising surface structures adapted to increase a surface area of the electronic arrangement,
    wherein the surface structures comprise a three-dimensional form,
    wherein the mold compound provides an interface with the surface structures.

18. The electronic module of claim 17, wherein the mold compound is in direct contact with the surface structures.

19. The electronic module of claim 17, wherein the surface structures are formed on the spacing element.

20. The electronic module of claim 17, wherein the electronic module further comprises a plurality of spacing elements.

* * * * *